United States Patent
Engel et al.

(10) Patent No.: US 10,291,248 B2
(45) Date of Patent: May 14, 2019

(54) RANDOMIZED TIME-INTERLEAVED DIGITAL-TO-ANALOG CONVERTERS

(71) Applicant: Analog Devices, Inc., Norwood, MA (US)

(72) Inventors: Gil Engel, Lexington, MA (US); Shawn S. Kuo, Arlington, MA (US); Steven C. Rose, Woburn, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/950,436

(22) Filed: Apr. 11, 2018

(65) Prior Publication Data

US 2018/0302100 A1 Oct. 18, 2018

Related U.S. Application Data

(63) Continuation of application No. 15/490,762, filed on Apr. 18, 2017, now Pat. No. 9,966,969.

(51) Int. Cl.
*H03M 1/06* (2006.01)
*H03M 1/12* (2006.01)
*H03M 1/66* (2006.01)

(52) U.S. Cl.
CPC ....... *H03M 1/1215* (2013.01); *H03M 1/0673* (2013.01); *H03M 1/66* (2013.01); *H03M 1/662* (2013.01)

(58) Field of Classification Search
None
See application file for complete search history.

(56) References Cited

U.S. PATENT DOCUMENTS

| | | | | |
|---|---|---|---|---|
| 6,356,224 B1* | 3/2002 | Wohlfarth | ................ | G06J 1/00 327/106 |
| 6,392,575 B1* | 5/2002 | Eklund | ............... | H03M 1/0673 341/118 |
| 9,793,910 B1* | 10/2017 | Devarajan | ........... | H03M 1/0634 |
| 2001/0052864 A1* | 12/2001 | Shimizu | ............. | H03M 1/0673 341/141 |

OTHER PUBLICATIONS

S. Balasubramanian et al., Systematic Analysis of Interleaved Digital-to-Analog Converters, IEEE Transactions on Circuits and Systems—II: Express Briefs, vol. 58, No. 12, Dec. 2011 (Year: 2011).*

* cited by examiner

*Primary Examiner* — Howard Williams
(74) *Attorney, Agent, or Firm* — Patent Capital Group (57) ABSTRACT

A time-interleaved digital-to-analog converter (DAC) uses M DAC cores to convert a digital input signal whose digital input words are spread to different DAC cores to produce a final analog outputs. The M DAC cores, operating in a time-interleaved fashion, can increase the sampling rate several times compared to the sampling rate of just one DAC. However, sequential time-interleaving DAC cores often exhibit undesirable spurs at the output. To spread those spurs to the noise floor, the time-interleaving DAC cores can be selected at a pseudo randomized manner or in a specific manner which can break up the sequential or periodic manner of selecting the DAC cores.

20 Claims, 7 Drawing Sheets

RANDOMIZED TIME-INTERLEAVED DIGITAL-TO-ANALOG CONVERTERS

PRIORITY DATA

This application is a continuation of U.S. patent application Ser. No. 15/490,762, filed Apr. 18, 2017 and entitled "RANDOMIZED TIME-INTERLEAVED DIGITAL-TO-ANALOG CONVERTERS", which is hereby incorporated by reference in its entirety.

TECHNICAL FIELD OF THE DISCLOSURE

The present invention relates to the field of integrated circuits, in particular to time-interleaved digital-to-analog converters (DAC cores).

BACKGROUND

In many electronics applications, digital-to-analog converters (DACs or DAC cores) converts a digital input signal to an analog output signal. High speed (e.g., ≥30 megasamples per second (MSPS)) DAC cores can be used in products that involve wideband radio frequency, intermediate frequency signal processing, and general-purpose baseband classes. These products are employed in wired and wireless communications, instrumentation, radar, electronic warfare, and other applications. Some high speed DAC cores can range from 30 MSPS to multi-gigasamples per second with resolutions ranging from 8 bits to 16 bits.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

A time-interleaved digital-to-analog converter (DAC) uses M DAC cores to convert a digital input signal whose digital input words are spread to different DAC cores to produce a final analog outputs. The M DAC cores, operating in a time-interleaved fashion, can increase the sampling rate several times compared to the sampling rate of just one DAC. However, sequential time-interleaving DAC cores often exhibit undesirable spurs at the output. To spread those spurs to the noise floor, the time-interleaving DAC cores can be selected at a pseudo randomized manner or in a specific manner which can break up the sequential or periodic manner of selecting the DAC cores.

Moreover, the time-interleaved DAC and a randomized time-interleaved DAC can be programmed to achieve different performance goals. In some cases, a randomized time-interleaved DAC can operate with different randomization schemes. Choosing different randomization schemes can trade one performance metric for another. In some cases, the randomization methodology can differ. In one configurable time-interleaved DAC, less time can be allotted for a DAC to settle or complete conversion so that an idle DAC can be chosen randomly from more number of idle DAC cores to increase the amount of randomization. The amount of "color" in the noise floor shape can be traded for other performance metrics.

Understanding Time-Interleaved DAC Cores

A DAC core comprises electronic circuits that convert a digital input signal to a continuous physical quantity carried by an analog signal that represents the original digital input signal's value. Key parameters that define a DAC or a DAC core is its resolution, maximum sample rate (i.e., how many samples can it convert at a time, usually measured in megasamples per second (MSPS) for high speed DAC cores, and sometimes referred as the speed of the converter), accuracy, and reliability. In some cases, power consumption can also be concern for DAC cores. It has become more challenging for a single DAC core to meet the demands that some applications require. To overcome the speed limits on a single DAC core, it is possible to implement a time-interleaved DAC, which has multiple slower DAC cores. Time-interleaving the slower DAC cores can increase the effective or aggregate sample rate while the slower DAC cores can operate in parallel to convert an analog input word one after another (i.e., in a time-interleaved fashion). In one example, a time-interleaved DAC can have M DAC cores. Each DAC core can operate at Fs/M as the sample rate, where Fs is the desired aggregate/effective sample rate. Each one of these DAC cores would be selected sequentially or in a round robin or rotating fashion, one after another, e.g., DAC Core #1, DAC Core #2, ... DAC Core #M, DAC Core #1, DAC Core #2, ... and so forth. A drawback of this time-interleaved architecture is the (undesirable) interleaving spurs that would manifest at the output due to the mismatches between the DAC cores. Differences in the circuitry between DAC cores and the periodicity in which these DAC cores are selected would lead to a non-ideal output (having the interleaving spurs) when the time-interleaved DAC cores are generally assumed to be matched. The spurs or tones are distortions that can greatly affect the performance of the time-interleaved DAC.

Randomized Time-Interleaved DAC Cores

To address the presence of spurs at the output spectrum of time-interleaved DAC cores, a circuit designer can attempt to design and calibrate the DAC cores to reduce the mismatches between the DAC cores. However, design and calibration can only remove a limited amount of the mismatches between the DAC cores, especially for DACs requiring >15 GSPS as its sample rate. To address the issue, the selection of time-interleaved DAC cores can be randomized. As a result, the periodicity that would otherwise be present for sequential time-interleaving DACs can be reduced, and the interleaving spurs caused by mismatches (even the remaining mismatches after calibration) can be spread in the noise floor, or in some cases the energy of the interleaving spurs can be pushed out of band of interest. Besides being able to achieve higher sample rates, utilizing slower DAC cores can relax certain design requirements (e.g., speed, complexity, power, linearity, timing, etc.) on the DAC cores themselves, since a slower DAC core may be easier to design.

Figure 1:
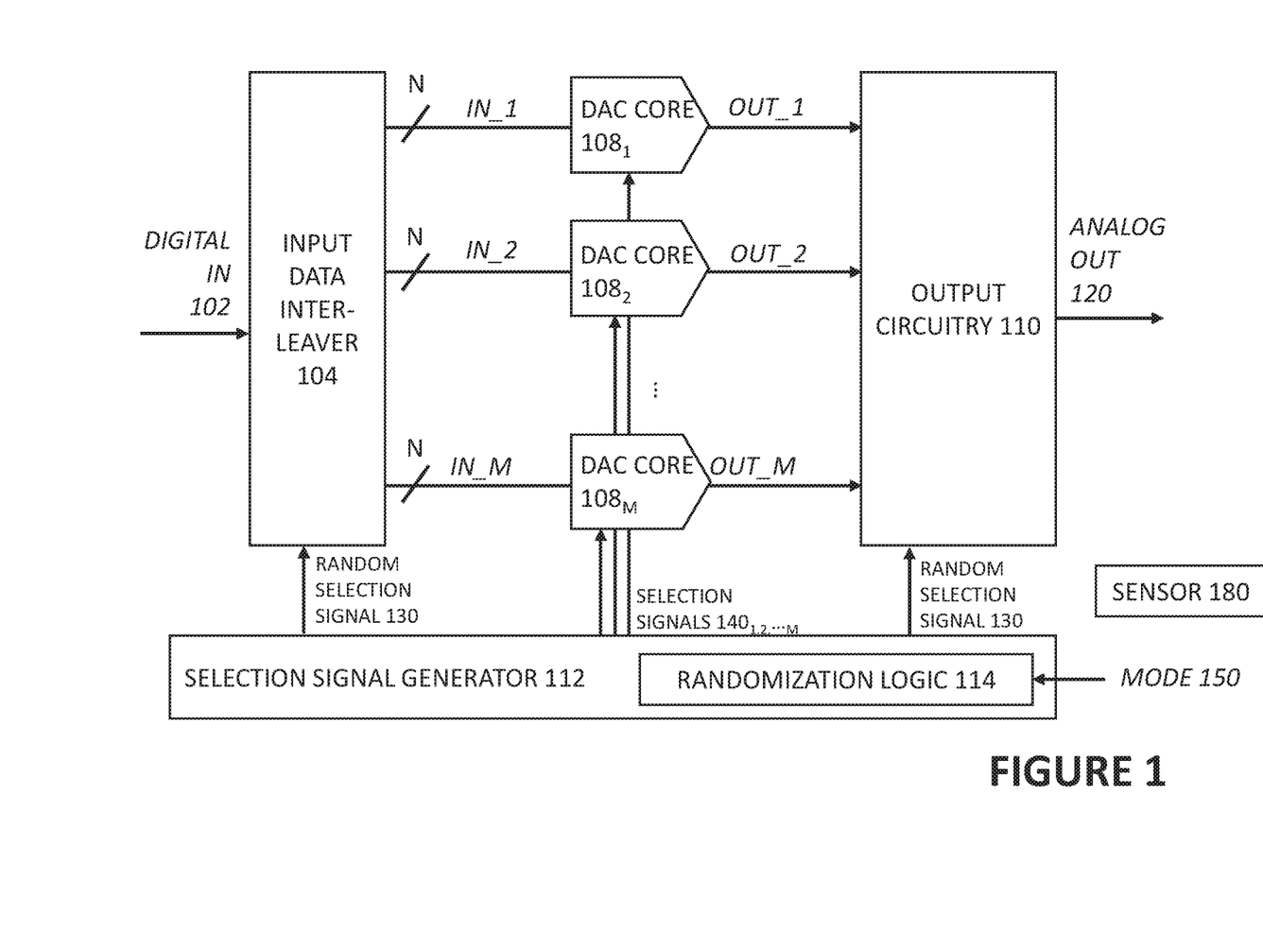
FIG. 1 shows an exemplary randomized time-interleaved DAC having M DAC cores, according to some embodiments of the disclosure.

FIG. 1 shows an exemplary randomized time-interleaved DAC having M DAC cores, DAC core $108_1$, DAC core $108_2$, . . . DAC core $108_M$. Together, with appropriate clocking, the M DAC cores can provide an aggregate or effective sampling rate that is much greater than a single DAC core. The plurality of digital-to-analog converter cores (e.g., DAC core $108_{1, \ldots, M}$) operate in a randomized time-interleaved manner. The randomized time-interleaved DAC has an effective sample rate which is greater than a sample rate of one of the DAC cores. Each DAC core comprises circuitry for receiving a respective multi-bit digital input word, e.g., an N-bit digital input word for each input IN_1, IN_2, . . . IN_M. The circuitry of each DAC core can generate a respective analog output OUT_1, OUT_2, . . . OUT_M based on the received digital input word. In one example, the sample rate of one of the DAC cores is Fs/M, and the aggregate randomized time-interleaved DAC can be as fast as Fs. Each DAC cores individually operate at a sample rate that is lower than Fs. Because the selection of the DAC cores is at least in part randomized, the interleaving spurs can be "averaged", and their negative effects can be reduced.

Appropriate clocking can be provided by selection signal generator 112 to generate random selection signal 130. As shown, random selection signal 130 can be provided to input data interleaver 104, and random selection signal 130 can be provided to output circuitry 110. Random selection signal 130 can indicate which one of the DAC core $108_{1, \ldots, M}$ is being selected for a given period. In some embodiments, the random selection signal 130 can represent a sequence selecting different DAC cores, and the sequence has at least some randomization. Selection signal generator 112 can generate selection signals $140_{1,2,\ldots,M}$ for respective DAC cores (e.g., DAC core $108_{1,\ldots,M}$). The selection signals $140_{1,2,\ldots,M}$ can select, in a pseudo-randomized fashion, one of the DAC cores to perform conversion at a given period or cycle. Selection signals $140_1$, $140_2$, . . . $140_M$, having different phases, can activate or trigger one of the M DAC cores for converting an digital input word for a given period or cycle and converting an digital input word to an analog output. M can be greater than or equal to three.

Input Data Interleaver

A digital input signal (DIGITAL IN 102) having a series of digital input words to be converted can be provided to an input data interleaver 104. The input data interleaver 104 can distribute the series of digital input words to different DAC cores selected to perform conversion at different periods. In other words, one selected DAC core receives one digital input word from the series at a time.

In some embodiments, the input data interleaver 104 comprises digital logic having respective data lines to the DAC cores, and distributes a given digital input word in the series of digital input words to the appropriate DAC core as specified by the random selection signal 130. In some embodiments, the input data interleaver 104 includes a memory for each DAC core. The memory can latch and hold a digital input word at the input to the DAC core (being distributed according to the random selection signal) so that the digital input word is valid at the input to the DAC core for a period of time (e.g., for a duration of time needed by the DAC core). In some embodiments, the input data interleaver 104 includes a switch network, e.g., a multiplexer, for distributing the digital input words to the inputs of the DAC cores, where the switch network is controlled by the random selection signal 130 indicating a selection of one of the DAC cores to perform conversion for a given period.

Output Circuitry

The DAC cores can produce corresponding analog outputs, OUT_1, OUT_2, . . . OUT_M, respectively, which are then combined by the output circuitry 110. The output circuitry 110 can generate an analog output of the randomized time-interleaved DAC based on the outputs of the DAC cores.

In some embodiments, the output circuitry is performs summation of all of the analog outputs of the DAC cores (e.g., OUT_1, OUT_2, . . . OUT_M), and includes a summation node for summing the outputs of the DAC cores.

In some embodiments, the output circuitry comprises switches which selects and steers an output of a DAC core, e.g., a current output if the DAC core is a current steering DAC, having valid analog output data towards an output of the randomized time-interleaved DAC, i.e., ANALOG OUT 120. The switches may be controlled by appropriate clocking signals. The clocking signals can have timing which corresponds to random selection signal 130 and/or selection signals $140_{1,2,\ldots,M}$, so as to generate a final analog output (ANALOG OUT 120) properly. The clocking signals can switch on one or more transistors which can couple or steer an output of a (selected) DAC core having the desired analog output data to the final output (ANALOG OUT 120).

The Randomization Logic: Randomization Schemes and Programmability

As mentioned previously, sequential interleaving suffers from the property that any mismatches between the M DAC cores and even errors after error calibration would show up in the DAC cores output frequency spectrum (e.g., a spectrum generated by a Fast Fourier Transform) as spurs in discrete frequency bins with large concentrated energy content. These spurs can be undesirable for many applications, and can significantly affect the dynamic performance of the time-interleaved DAC. To address this issue, time-interleaved DACs can operate in a pseudo-randomized fashion, so that the mismatch errors would be "averaged out". As a result, the spurs mentioned previously can be "spread over the noise floor". Randomization of the selection of DAC cores can be implemented in different ways, and the following passages illustrate some examples of randomization. Referring back to FIG. 1, the selection signal generator 112 comprises randomization logic 114 which can implement one or more desired randomization schemes. The randomization logic can generate a random selection signal 130 to control the input interleaver 104 and/or output circuitry 110.

In some examples, to implement pseudo-randomization of the selection of DAC cores, one of the idle or ready-to-convert DAC core (generally one or more other DAC cores would be busy performing a conversion of a digital input word) can be randomly selected by the randomization logic 114 as the selected DAC core to convert a digital input word for a given period to an analog output. The selection signal generator 112 comprises randomization logic 114 which can select one DAC core from available ones of the DAC cores in a random manner to perform conversion of a next digital input word for a next period. Available, as used herein, means the DAC core is ready to perform conversion for the next period. For instance, for 4 DAC cores, it is possible that two DAC cores are available for selection while two other DAC cores are busy performing a conversion. The randomization logic 114 can randomly select one of the two available DAC cores to convert the next digital input word for the next period.

In some examples, the randomization logic 114 implements randomization in a manner which shapes noise introduced by the mismatches between DAC cores. For instance, the randomization may break up periodicity or sequential selection of DAC cores at a certain frequency or certain set of frequencies to move the noise out of band. Phrased differently, the randomization logic 114 can introduce randomization to the selection of DAC cores, so that the selection of DAC cores no longer have periodic behavior at a certain frequency or certain sets of frequencies (e.g., a range of frequencies, a spread of frequencies, or frequencies chosen at random from a range of frequencies).

In some examples, the randomization logic 114 can implement randomization by activating DAC cores in a round robin fashion based on a pointer identifying a starting DAC core and moving the pointer, periodically, to a different starting DAC core that is selected randomly. For instance, the sequence may rotate through DAC cores 1, 2, 3, 4, 1, 2, 3, 4, . . . with DAC core 1 being the starting DAC core. Periodically (e.g., at a given frequency), the randomization logic 114 can change the starting DAC core to another DAC core that is chosen at random. For instance, the sequence may then rotate from DAC core 3, 4, 1, 2, 3, 4, 1, 2, . . . with DAC core 3 as the starting DAC core.

In some examples, the randomization logic 114 can implement randomization by activating DAC cores in a round robin fashion based on a pointer identifying a starting DAC core, and moving the pointer to a different starting DAC core probabilistically or randomly (e.g., the pointer can be changed to a different starting DAC from time to time in a randomized fashion). For instance, the sequence may rotate through DAC cores 1, 2, 3, 4, 1, 2, 3, 4, . . . with DAC core 1 being the starting DAC core. At random (e.g., based on some predetermined probability function), the randomization logic 114 may change the starting DAC core to another DAC core, which can be the adjacent DAC core to the previous starting DAC core, or the DAC core can be chosen at random. For instance, the sequence may then rotate from DAC core 4, 1, 2, 3, 4, 1, 2, 3, . . . with DAC core 4 as the starting DAC core.

In some examples, the randomization logic 114 can implement randomization by changing direction of rotation of DAC cores probabilistically, at a certain frequency, at a set of frequencies, at one or more frequencies chosen at random. For instance, the sequence may rotate through DAC cores 1, 2, 3, 4, 1, 2, 3, 4, . . . The randomization logic 114 can change the direction of rotation, and the sequence run 3, 2, 1, 4, 3, 2, 1, 4 . . . .

In some embodiments, the randomization mode (e.g., indicated by the MODE signal 150 received by randomization logic 114) adjusts a number of DAC cores which are available for random selection for a given period. When more or less number of available DAC cores vary, the amount of randomization also varies. As a result, the coloring of the interleaving spurs (e.g., a measure of how spread out the interleaving spurs are) can also vary. Adjusting the number of available DAC cores can be done by adding one or more DAC core available for conversion (e.g., the randomized time-interleaved DAC may have "spare DAC cores" which can be added and placed in operation (they may be otherwise disconnected or turned off). Another way to adjust the number of available DAC cores is to generate signals to control a period of time each DAC core is busy until the DAC can perform conversion again to affect an amount of randomization in the randomized time-interleaved DAC. If the period of time a DAC core is busy is reduced, it is possible to increase the number of available DAC cores for random selection. In some implementations, it is possible to adjust the sampling rate of a DAC core to make more/less DAC cores available for random selection, in order to vary the amount of randomization.

In some examples, the randomization logic 114 implement a combination of randomization schemes, such as a combination of one or more schemes described herein. For instance, the pointer for the starting DAC core for rotation and the direction of rotation can both be randomized. Other combinations are envisioned by the disclosure.

The randomization logic 114, in some cases, can receive a signal (MODE signal 150) indicating a randomization mode (or scheme), and adjust, based on the indicated randomization mode, a randomization method used to determine the randomized sequence. In other words, different kinds of randomization schemes or combination of randomization schemes can be selected and implemented. Appropriate random selection signal and selection signals would be generated accordingly. The randomization can be configurable and selected to suit a particular application of the DAC. The programmability can allow a user to trade the one or more performance metrics for another one or more performance metrics. One possibility is the ability to change the randomization mode or scheme which could affect the amount of "coloring" in the output spectrum. In some embodiments, the changing of the randomization mode or scheme may not affect the amount of "coloring" in the output spectrum, but can allow the system to the one or more performance metrics for another one or more performance metrics. In some embodiments, the amount of "coloring" in the output spectrum can be affected by the amount of randomization of the randomized time-interleaved DAC. The amount of randomization can be affected by the manner of how the time-interleaved DAC cores are selected. In some cases, the amount of randomization can be affected by the number of DAC cores available for selection in a pseudo-randomization scheme (however, power consumption may go up if more DAC cores are enabled for data conversion).

In one example, a user may decide to implement a specific tradeoff between some performance metrics. In another example, just before use, a chip manufacturer may decide to tune/tweak the performance metrics for a particular target application without having to change the silicon. In some cases, the changing of randomization modes is triggered based on one or more operating conditions. If the temperature is high, and it is desirable to tradeoff one performance metric for another to compensate for high temperature, a control signal from a sensor 180 or other circuitry (e.g., including one or more of: sensor on chip, and sensor off-chip) can signal to the randomization logic 114 to change the randomization mode. The sensor or other circuitry can include one or more of: a temperature sensor, gyroscope, light sensor, humidity sensor, pressure sensor, etc.

In some cases, the randomization mode is selected based on one or more characteristics of DIGITAL IN 102 and/or ANALOG OUT 120. Performance of the DAC core can often change based on characteristics such as bandwidth, frequency, amplitude, or amount of noise in the signals. If a characteristic of the signal can negatively affect a particular performance metric, it may be desirable to compensate for the loss in that performance metric (or to make up for the loss by increasing another performance metric) by adjusting the randomization mode. A processor generating the DIGITAL IN 102 has information about the signal directly to determine its characteristics. To sense a characteristic of the analog output signal, circuitry (e.g., a sensing ADC) can be included to directly sense the analog output signal ANALOG OUT 120, or any of the analog output signals from the DAC cores. A control signal (e.g., MODE signal 150) can signal to the randomization logic 114 to change the randomization mode based on the one or more characteristics of DIGITAL IN 102 and/or ANALOG OUT 120. The control signal can be generated by the processor or other suitable circuitry, based on one or more characteristics of the signal, e.g., DIGITAL IN 102 and/or ANALOG OUT 120.

Exemplary Timing Diagram

Figure 2:
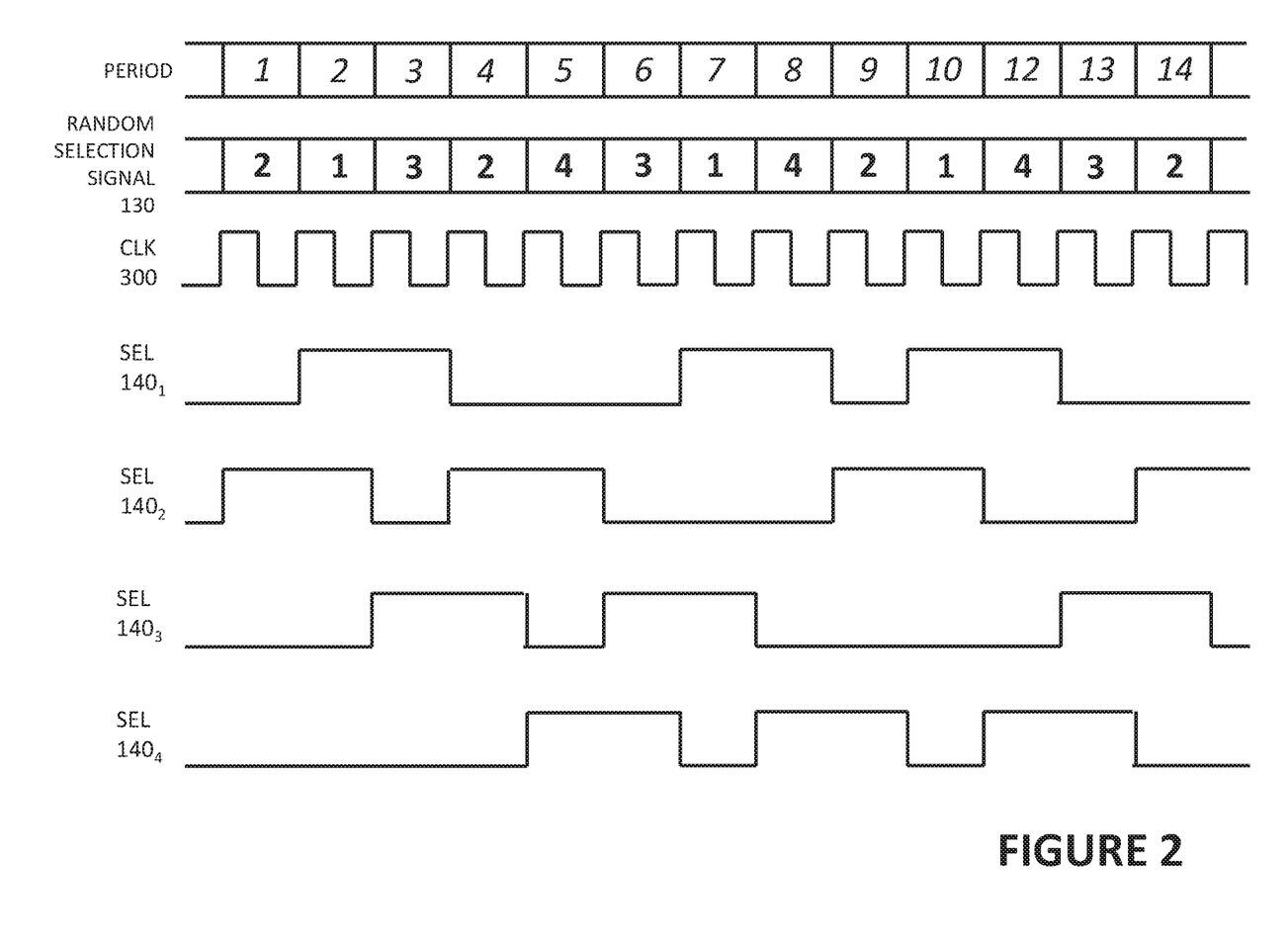
FIG. 2 illustrates timing and selection of a randomized time-interleaved DAC having M DAC cores, according to some embodiments of the disclosure.

FIG. 2 illustrates timing and selection of a randomized time-interleaved DAC having M DAC cores, according to some embodiments of the disclosure. In this example, there are four DAC cores, which are controlled by selection signals shown as SEL $104_1$, SEL $140_2$, SEL $140_3$, SEL $140_4$ (corresponding to selection signals $140_{1,2,\ldots M}$ seen in FIG. 1). A clock signal 300 running at the effective sample rate of the randomized time-interleaved DAC is shown as well. The random selection signal 130 indicating which one of the DAC cores is selected for a given period is also shown.

In contrast to time-interleaved analog-to-digital converters (ADCs) which are triggered by edges of a selection signal, time-interleaved DAC cores are triggered using pulses (i.e., pulses in the selection signals). The timing of the pulses can directly affect the performance of the interleaved DAC cores (timing of pulses is not a concern for interleaved ADCs). A given selection signal selects a DAC core to perform conversion by activating the selected DAC core to perform conversion over a duration of a pulse in the given selection signal. The selection signal is otherwise a logical "low", or has a state which does not activate the DAC core.

In this example, a DAC core operates for a duration of two clock cycles, and a pulse activating a selected DAC core has a duration of two clock cycles. The exemplary random selection signal selects the DAC cores and appropriate selection signals as shown are generated. During period 1, DAC core $108_2$ is selected and the selection signal $140_2$ has a "high" pulse for two clock periods. During period 2, DAC core $108_1$ is selected and the selection signal $140_1$ has a "high" pulse for two clock periods.

As seen in the illustration, the overall randomized time-interleaved DAC can process samples at a higher effective sample rate (i.e., a sample at each clock cycle) than a sample rate of a single DAC core which requires a duration of two clock cycles to process a sample (i.e., a sample over two clock cycles).

Figure 3:
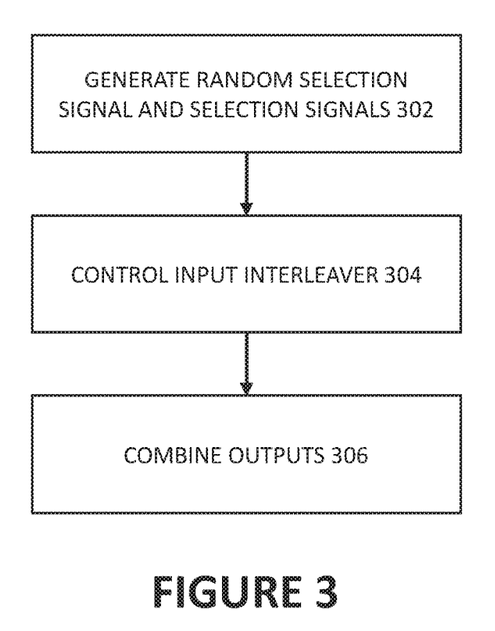
FIG. 3 illustrates a method for randomly interleaving DAC cores, according to some embodiments of the disclosure.

Exemplary Methods for Operating Interleaved DAC Cores in a Random Manner to Reduce Interleaving Spurs FIG. 3 illustrates a method for randomly interleaving DAC cores (e.g., DAC core $108_1$, DAC core $108_2$, ... DAC core $108_M$ of FIG. 1) according to some embodiments of the disclosure. The method can reduce interleaving spurs of time-interleaved DAC cores. In 302, random selection signal (e.g., random selection signal 130 of FIG. 1) and/or selection signals (e.g., selection signals $140_{1,2,\ldots M}$ of FIG. 1) are generated for respective DAC cores (e.g., by selection signal generator 112 of FIG. 1). The random selection signal and/or selection signals can operate the DAC cores in a time interleaved manner according to a randomized sequence to achieve an effective sample rate that is greater than a sample rate of one of the DAC cores. The randomized sequence can be implemented according to the illustrative examples described herein. In 304, an input interleaver (e.g., input data interleaver 104) can be controlled according to the randomized sequence to provide digital input words to the respective DAC cores according to the randomized sequence. In other words, the digital input words are distributed to the DAC cores according to the randomized sequence. In 306, an analog output (ANALOG OUT 120 of FIG. 1) is generated based on outputs of the DAC cores (e.g., OUT_1, OUT_2, ... OUT_M). In some cases, the analog output is generated by combining the outputs of the DAC cores.

Figure 4:
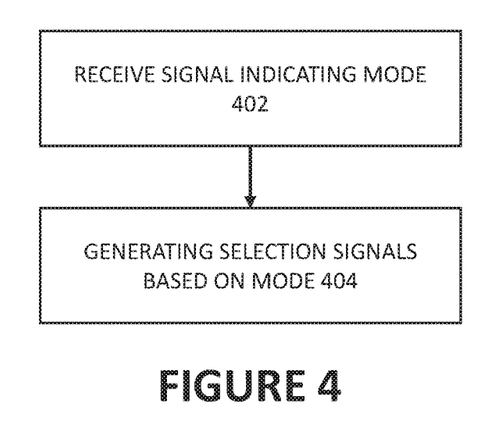
FIG. 4 shows a method for operating a time-interleaving DAC under different modes, according to some embodiments of the disclosure, according to some embodiments of the disclosure.

FIG. 4 shows a method for operating a time-interleaving DAC under different modes, according to some embodiments of the disclosure, according to some embodiments of the disclosure. In 402, selection signal generator (e.g., selection signal generator 112 of FIG. 1) can receive a signal (e.g., MODE signal 150 of FIG. 1) indicating mode, e.g., a particular randomization scheme. In 404, the selection signal generator can generate selection signals (e.g., selection signals $140_{1,2,\ldots M}$ of FIG. 1) based on the mode indicated by the signal.

Figure 5:
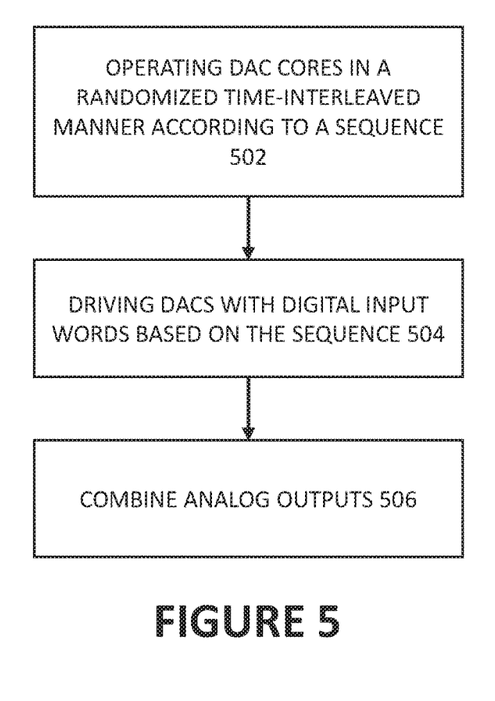
FIG. 5 shows a method for reducing output spurs of a time-interleaved DAC.

FIG. 5 shows a method for reducing output spurs of a time-interleaved DAC.

In 502, DAC cores (e.g., DAC core $108_1$, DAC core $108_2$, ... DAC core $108_M$ of FIG. 1) are operated in a time-interleaved manner according to a sequence that is at least in part randomized. Each DAC core operates at a first sample rate. In 504, the DAC cores are driven with digital input words according to the sequence (the digital input words are distributed to DAC cores according to the sequence). In 506, analog outputs of the DAC cores (e.g., OUT_1, OUT_2, ... OUT_M of FIG. 1) are combined to generate a final analog output (e.g., ANALOG OUT 120 of FIG. 1) representative of the digital input words. The digital input words are being converted to respective analog outputs of the DAC at a sample rate which is greater than the first sample rate. In other words, the digital input words are distributed to the DAC cores at a rate which is greater than the first sample rate.

Other Randomization Schemes for Time-Interleaved DAC Cores

Sequence of operating time-interleaved DAC cores can be randomized in different ways. The following passages illustrates further examples.

Figure 6:
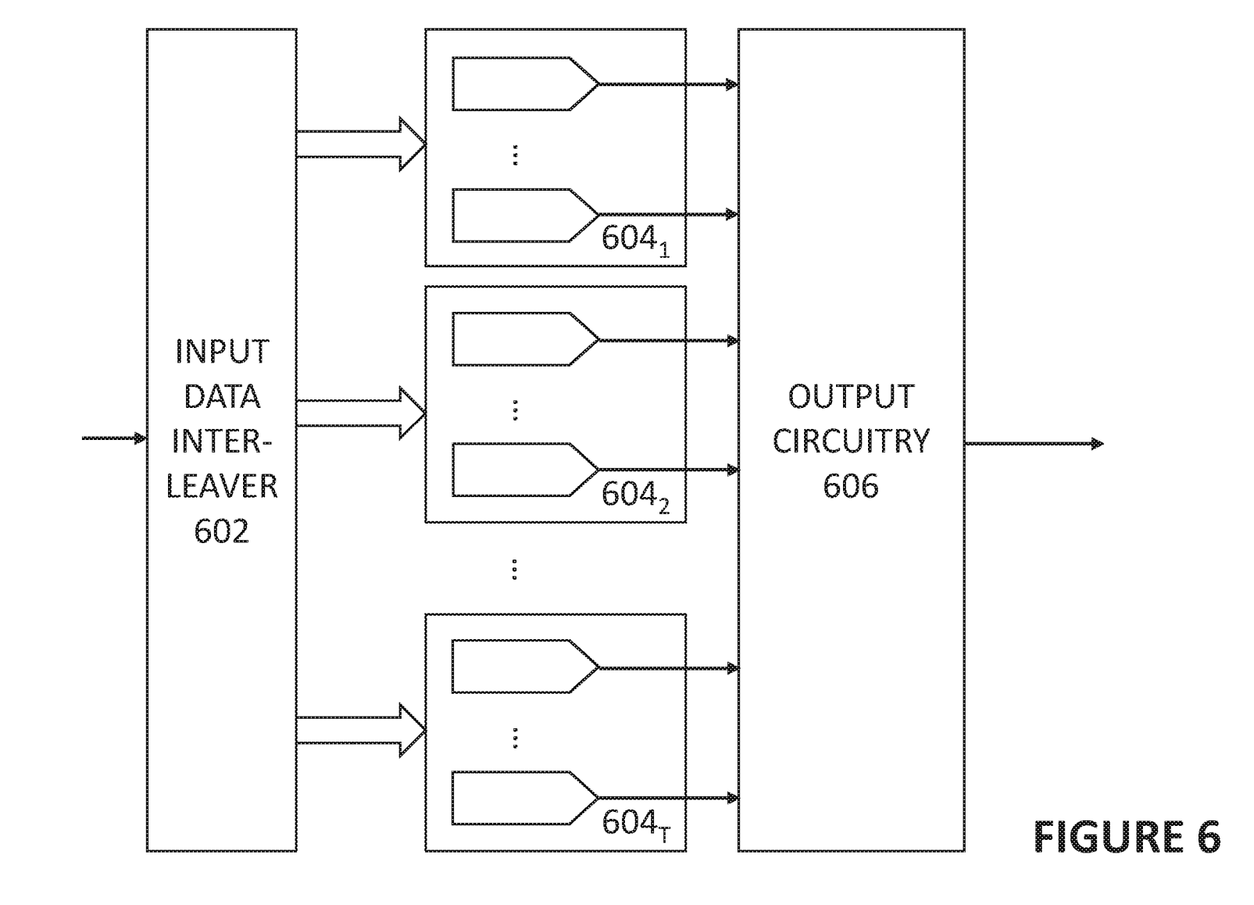
FIG. 6 shows another exemplary randomized time-interleaved DAC, according to some embodiments of the disclosure.

FIG. 6 shows another exemplary randomized time-interleaved DAC, according to some embodiments of the disclosure. The randomized time-interleaved DAC includes an input data interleaver 602, T groups of DAC cores $604_1$, $604_2$, ... $604_T$, and output circuitry 606 (which can be implemented in a ways described herein). For simplicity, selection signal generator and randomization logic are omitted from the FIGURE, but it is understood by one skilled in the art that the randomized time interleaved DAC would include such parts to implement randomized time-interleaving.

T can be greater than or equal to three, and each group of DAC cores can include two or more DAC cores. The number of DAC cores within each group of DAC cores do not necessarily have to be equal to each other. Rather than randomizing the selection of the DAC cores, the input data interleaver 602 can randomize the selection of a group of DAC cores. In other words, the input data interleaver 602 can randomize which group of DAC cores is used for the next set of digital words (the number of digital words can be equal to the number of DAC cores in the group). The sequence in which groups of DAC cores are used/selected can be randomized. The DAC cores of a selected group of DAC cores can follow a sequential scheme for converting the set of digital words provided to the group of DAC cores.

Figure 7:
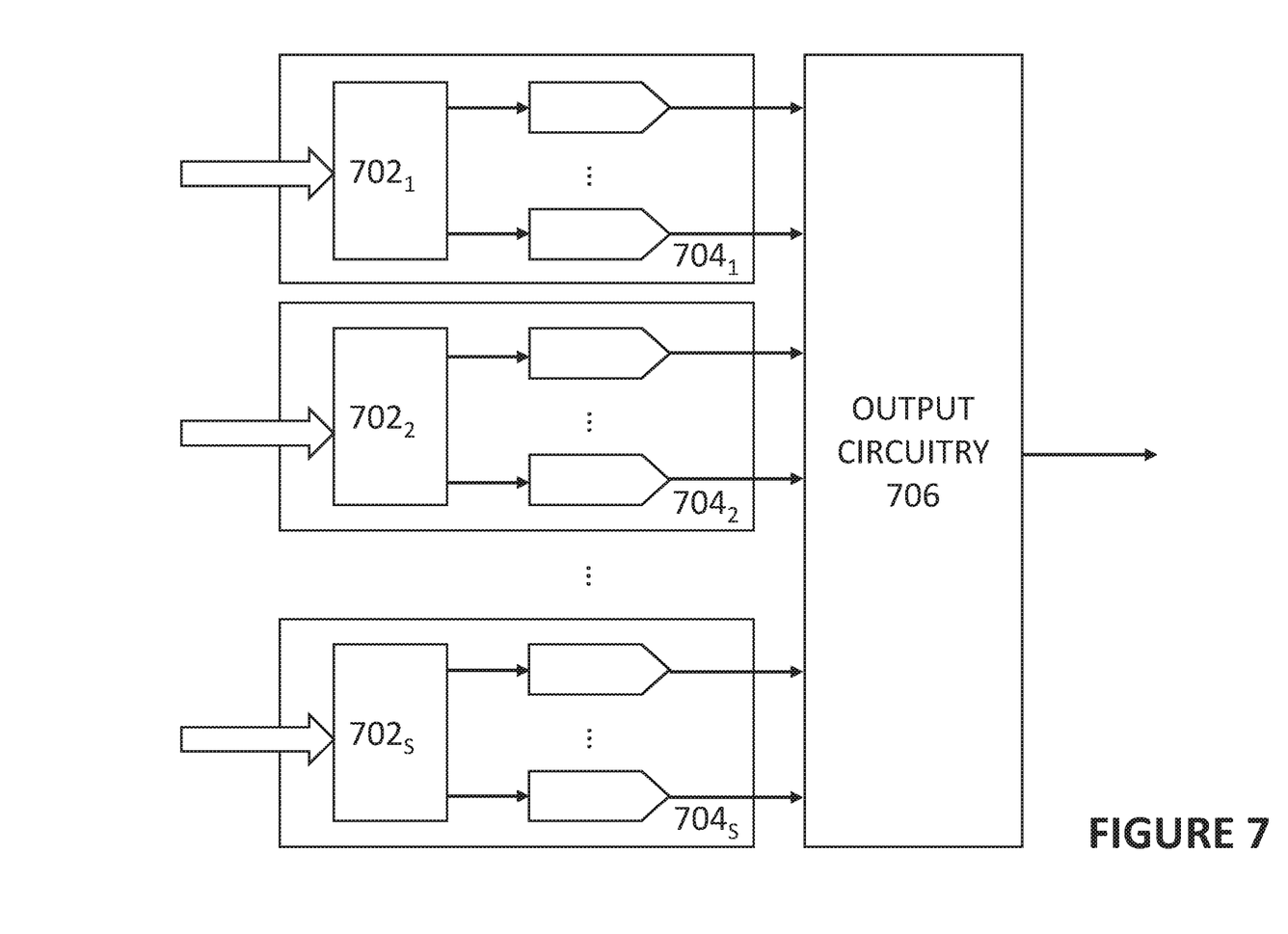
FIG. 7 shows yet another exemplary randomized time-interleaved DAC, according to some embodiments of the disclosure.

FIG. 7 shows yet another exemplary randomized time-interleaved DAC, according to some embodiments of the disclosure. The randomized time-interleaved DAC includes S groups of DAC cores $704_1$, $704_2$, . . . $704_S$, and output circuitry 706 (which can be implemented in a ways described herein). For simplicity, selection signal generator and randomization logic are omitted from the FIGURE, but it is understood by one skilled in the art that the randomized time interleaved DAC would include such parts to implement randomized time-interleaving.

S can be greater than or equal to two, and each group of DAC cores can include three or more DAC cores. The number of DAC cores within each group of DAC cores do not necessarily have to equal to each other. In this example, sets of digital words are provided sequentially to S groups of DAC cores $704_1$, $704_2$, . . . $704_S$ (the number of digital words in a set of digital words provided to a group of DAC cores can equal to the number of DAC cores in the group of DAC cores). Each group of DAC cores has a corresponding input data interleaver, e.g., input data interleaver $702_1$, $702_2$, . . . $702_S$. The input data interleaver of a given group of DAC cores can distribute the received set of digital words in a randomized fashion to the DAC cores in the group. The randomization scheme implemented within a group of DAC cores can include any one of the schemes mentioned herein for randomly selecting a DAC core from a plurality of DAC cores. The DAC cores in a group of DAC cores, e.g., any one of DAC cores $704_1$, $704_2$, . . . $704_S$ can operate in a sequence that is at least partially randomized. In some embodiments, a randomization mode may select only a subset of groups of DAC cores $704_1$, $704_2$, . . . $704_S$ to implement a randomized time-interleaving scheme. In some embodiments, a randomization mode may randomize which one of the groups of DAC cores $704_1$, $704_2$, . . . $704_S$ at a given period to implement the randomized time-interleaving scheme. For instance, the DAC cores within a group can operate sequentially for a period of time, but at a randomized time period, the DAC cores of a particular/randomly selected group can operate in a randomized time-interleaved fashion. In some embodiments, a randomization mode may implement a randomized time-interleaving scheme within a particular group of DAC cores or for all groups of DAC cores only certain period of times (periodically, at selected frequencies, or at randomized time instants).

Referring back to examples illustrated in FIGS. 6-7, groups of DAC cores can be disabled or enabled, depending on the desired operating mode. In some embodiments, a randomization mode may disable one or more groups (any one or more of: groups of DAC cores $704_1$, $704_2$, . . . $704_S$, and groups of DAC cores $604_1$, $604_2$, . . . $604_T$) from being used for data conversion. Conversely, a randomization mode may enable only a subset of groups for data conversion.

EXAMPLES

Example 1 is a randomized time-interleaved digital-to-analog converter (DAC), comprising a plurality of digital-to-analog converter cores (DAC cores) operating in a randomized time-interleaved manner, wherein the randomized time-interleaved DAC has an effective sample rate which is greater than a sample rate of one of the DAC cores.

In Example 2, Example 1 can further include: selection signal generator for generating selection signals for respective DAC cores, wherein selection signals selects, in a pseudo-randomized fashion, one of the DAC cores to perform conversion at a given period.

In Example 3, any one of Examples 1-2 can further include a given selection signal selecting a DAC core to perform conversion by activating the selected DAC core to perform conversion over a duration of a pulse in the given selection signal.

In Example 4, any one of Examples 1-3 can further include the selection signal generator comprising randomization logic which selects one DAC core from available ones of the DAC cores in a random manner to perform conversion of a next digital input word for a next period.

In Example 5, any one of Examples 1-4 can further include the selection signal generator comprising logic receiving a signal indicating mode and generating signals to control a period of time each DAC core is busy until the DAC can perform conversion again to affect an amount of randomization in the randomized time-interleaved DAC based on the signal indicating mode.

In Example 6, any one of Examples 1-5 can further include an input data interleaver for distributing a series of digital input words to different DAC cores selected to perform conversion at different periods.

In Example 7, Example 6 can further include the input data interleaver comprising a multiplexer controlled by a random selection signal indicating a selection of one of the DAC cores to perform conversion for the given period.

In Example 8, any one of the Examples 1-7 can further include output circuitry for generating an analog output of the randomized time-interleaved DAC based on the outputs of the DAC cores.

In Example 9, Example 8 can further include the output circuitry comprising a summation node for summing the outputs of the DAC cores.

In Example 10, Example 8 can further include the output circuitry selecting and steering an output of a DAC core having valid analog output data towards an output of the randomized time-interleaved DAC.

In Example 11, any one of Examples 1-19 can further include the DAC cores each comprising circuitry for receiving a respective multi-bit digital input word and generating a respective analog output based on the received digital input word. Each DAC core can have a plurality of DAC cells, each cell for converting a bit of the digital input word into a part of a final analog output of the DAC core.

Example 12 is a method for reducing interleaving spurs of time-interleaved digital-to-analog converter cores (DAC cores), comprising: generating selection signals for respective DAC cores, wherein the selection signals operates the DAC cores in a time interleaved manner according to a randomized sequence to achieve an effective sample rate that is greater than a sample rate of one of the DAC cores; controlling input interleaver to provide digital input words to the respective DAC cores according to the randomized sequence; and generating an analog output based on outputs of the DAC cores.

In Example 13, Example 12 can further include a given selection signal selecting a DAC core to perform conversion by activating the selected DAC core to perform conversion over a duration of a pulse in the given selection signal.

In Example 14, any one of Examples 12-13 can further include generating a random selection signal to control the input interleaver.

In Example 15, any one of Examples 12-14 can further include: receiving a signal indicating a randomization mode;

and adjusting, based on the indicated randomization mode, a randomization method used to determine the randomized sequence.

In Example 16, Example 15 can further include the randomization mode adjusting a number of DAC cores which are available for random selection for a given period.

In Example 17, any one of Examples 12-16 can further include the randomized sequence activating DAC cores in a round robin fashion based on a pointer identifying a starting DAC core, wherein the pointer is moved, periodically, to a different starting DAC core selected randomly.

In Example 18, any one of Examples 12-17 can further include randomized sequence activating DAC cores in a round robin fashion based on a pointer identifying a starting DAC core, wherein the pointer is moved to a different starting DAC core probabilistically.

Example 19 is an apparatus for interleaving a plurality of digital-to-analog converter cores (DAC cores) of to reduce output spurs, the apparatus comprising: means for operating the DAC cores in a time-interleaved manner according to a sequence that is at least in part randomized, wherein each DAC core operates at a first sample rate; means for driving the DAC cores with digital input words based on the sequence; and means for combining analog outputs of the DAC cores to generate a final analog output representative of the digital input words; wherein the digital input words are being converted to respective analog outputs of the DAC at a sample rate which is greater than the first sample rate.

In Example 20, Example 19 can further include: means for adjusting, based on a received indicated randomization mode, a randomization method used to determine the sequence.

In Example 21, any one of Examples 19-20 can further include means for implementing any one of the methods or parts in Examples 12-18.

Variations and Implementations

The present disclosure encompasses apparatuses which can perform the various methods described herein, including methods illustrated by FIGS. 3-5. Such apparatuses can include circuitry shown in FIGS. 1, and 6-7 or circuitry implementing functionalities described herein. In some cases, one or more parts of the apparatus can be provided by a processor specially configured for carrying out the functions described herein. Functionalities associated with the randomization logic 114 can be implemented in a processor. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that the activities discussed above with reference to the FIGURES are applicable to any integrated circuits that involve time-interleaved DAC cores. In certain contexts, the features discussed herein related to a high-speed DAC, i.e., the time-interleaved DAC, can be applicable to medical systems, scientific instrumentation, wireless and wired communications systems (especially systems requiring a high sampling rate), radar, industrial process control, audio and video equipment, instrumentation, and other systems which uses DACs. The level of performance offered by time-interleaved DAC can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

In the discussions of the embodiments above, the parts and components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions configuring a time-interleaved DAC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A randomized time-interleaved digital-to-analog converter (DAC), comprising:
    at least two groups of DAC cores, wherein:
        each group includes three or more DAC cores; and
        sets of digital words are provided sequentially to the groups of DAC cores; and
        each group of DAC cores comprises an input data interleaver to distribute a received set of digital words in a randomized time-interleaved manner to the DAC cores; and
    output circuitry to combine analog outputs of the groups of DAC cores.

2. The randomized time-interleaved DAC of claim 1, wherein:
    each group of DAC cores comprises a selection signal generator to generate a random selection signal; and
    the random selection signal selects one DAC core in the group of DAC core to perform conversion for a given period.

3. The randomized time-interleaved DAC of claim 2, wherein the random selection signal controls a multiplexer of the input data interleaver.

4. The randomized time-interleaved DAC of claim 1, wherein:
    for some time periods, first DAC cores of a first group of DAC cores convert a first received set of digital words in a sequential time-interleaved manner; and
    for some other time periods selected at random, the first DAC cores convert a second received set of digital words in a randomized time-interleaved manner.

5. The randomized time-interleaved DAC of claim 1, wherein:
    for some time periods, first DAC cores of a first group of DAC cores convert a first received set of digital words in a sequential time-interleaved manner; and
    for some other periods selected based on a frequency, the first DAC cores convert a second received set of digital words in a randomized time-interleaved manner.

6. The randomized time-interleaved DAC of claim 1, wherein one or more of the groups of DAC cores is disabled from being used for data conversion in response to a signal indicating a randomization mode.

7. The randomized time-interleaved DAC of claim 1, wherein:
    each group of DAC cores comprises a selection signal generator, the selection signal generator comprising randomization logic;
    the DAC cores within each group converts the received set of digital words in a round robin fashion based on a pointer identifying a starting DAC core; and
    the randomization logic implements randomization by changing the pointer to the starting DAC core to another DAC core.

8. The randomized time-interleaved DAC of claim 1, wherein:
    each group of DAC cores comprises a selection signal generator, the selection signal generator comprising randomization logic;
    the DAC cores within each group converts the received set of digital words in a round robin fashion in a first direction of rotation; and
    the randomization logic implements randomization by changing the first direction of rotation to a second direction of rotation at randomized time instants.

9. The randomized time-interleaved DAC of claim 1, wherein:
    each group of DAC cores comprises a selection signal generator, the selection signal generator comprising randomization logic; and
    the randomization logic changes an amount of randomization in the randomized time-interleaved DAC in response to a signal indicating a randomization mode.

10. The randomized time-interleaved DAC of claim 1, wherein:
    the randomized time-interleaved DAC further comprises one or more sensors;

each group of DAC cores comprises a selection signal generator comprising randomization logic; and the randomization logic changes an amount of randomization in the randomized time-interleaved DAC in response to a control signal from the one or more sensors.

11. The randomized time-interleaved DAC of claim 1, wherein:

each group of DAC cores comprises a selection signal generator, the selection signal generator comprising randomization logic;

the randomization logic changes an amount of randomization in the randomized time-interleaved DAC in response to a signal indicating a randomization mode;

the randomization mode is selected based on one or more characteristics of a digital input signal to the randomized time-interleaved DAC; and the one or more characteristics includes one or more of: bandwidth, frequency, amplitude, and amount of noise.

12. The randomized time-interleaved DAC of claim 1, wherein:

each group of DAC cores comprises a selection signal generator;

the selection signal generator comprises logic receiving a signal indicating mode; and the selection signal generator generates signals to control a period of time each DAC core in the group of DAC cores is busy until the DAC core can perform conversion again to affect an amount of randomization in the group of DAC cores based on the signal indicating mode.

13. The randomized time-interleaved DAC of claim 1, wherein:

the output circuitry comprises switches; and the switches selects and steers an output of a DAC core towards an output of the randomized time-interleaved DAC.

14. A randomized time-interleaved digital-to-analog converter (DAC), comprising:

at least three groups of DAC cores, wherein each group includes two or more DAC cores;

output circuitry to combine analog outputs of the groups of DAC cores; and an input data interleaver to randomize selection of a group of DAC cores to convert a next set of digital words;

wherein the DAC cores within a group of DAC cores sequentially converts a set of digital words received by the group of DAC cores in a time-interleaved fashion.

15. The randomized time-interleaved DAC of claim 14, wherein one or more of the groups of DAC cores is disabled from being used for data conversion in response to a selected randomization mode.

16. A method for reducing interleaving spurs of time-interleaved digital-to-analog converter (DAC) cores, the method comprising:

receiving digital input by a DAC, wherein the digital input comprises a first set of digital words and a second set of digital words following the first set of digital words;

providing the first set of digital words to a first group of at least three first DAC cores;

providing the second set of digital words to a second group of at least three second DAC cores;

distributing the first set of digital words to the first DAC cores according to a first randomized sequence; and combining analog outputs of the first group of DAC cores and analog outputs of the second group of DAC cores.

17. The method of claim 16, further comprising:

distributing the second set of digital words to the second DAC cores according to a second randomized sequence.

18. The method of claim 16, further comprising:

receiving a signal indicating mode; and adjusting a randomization method used to determine the first randomized sequence based on the mode.

19. The method of claim 16, further comprising:

receiving a signal indicating mode; and adjusting an amount of randomization in the first randomized sequence based on the mode.

20. The method of claim 16, wherein combining the analog outputs of the first group of DAC cores and the analog outputs of the second group of DAC cores comprises:

steering valid outputs of the first group of DAC cores towards an output of the time-interleaved DAC based on the first randomized sequence.

* * * * *